(12) United States Patent
Harada et al.

(10) Patent No.: US 6,921,949 B2
(45) Date of Patent: Jul. 26, 2005

(54) SEMICONDUCTOR INTEGRATED CIRCUIT DEVICE

(75) Inventors: Hirofumi Harada, Chiba (JP); Jun Osanai, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/609,957

(22) Filed: Jun. 30, 2003

(65) Prior Publication Data

US 2004/0124463 A1 Jul. 1, 2004

(51) Int. Cl.[7] .......................... H01L 29/76; G01R 19/00
(52) U.S. Cl. ..................... 257/369; 257/407; 257/412; 327/53; 327/66
(58) Field of Search ............................ 257/369, 407, 257/412; 327/53, 66

(56) References Cited

U.S. PATENT DOCUMENTS 4,618,785 A * 10/1986 van Tran ..................... 327/53
2002/0151129 A1 * 10/2002 Yoshida et al. ............. 438/227
2004/0124463 A1 * 7/2004 Harada et al. ............... 257/337

* cited by examiner

Primary Examiner—Mark V. Prenty
(74) Attorney, Agent, or Firm—Adams & Wilks

(57) ABSTRACT

A semiconductor integrated circuit device is comprised of an amplifier circuit having first and second PMOS and NMOS transistors. The first PMOS transistor has a gate electrode and a drain electrode connected together. The second PMOS transistor has a gate electrode connected to the gate electrode of the first PMOS transistor and a course electrode connected to a course electrode of the first PMOS transistor. The first NMOS transistor has a drain electrode connected to the drain electrode of the first PMOS transistor and a gate electrode sat as a first input terminal. The second NMOS transistor has a drain electrode connected to a drain electrode of the second PMOS transistor, a source electrode connected to a sourse electrode of the first NMOS transistor, and a gate electrode sat as a second input terminal. At least one of the first NMOS transistor and the second NMOS transistor is comprised of a buried channel transistor.

7 Claims, 3 Drawing Sheets

PRIOR ART FIG. 2
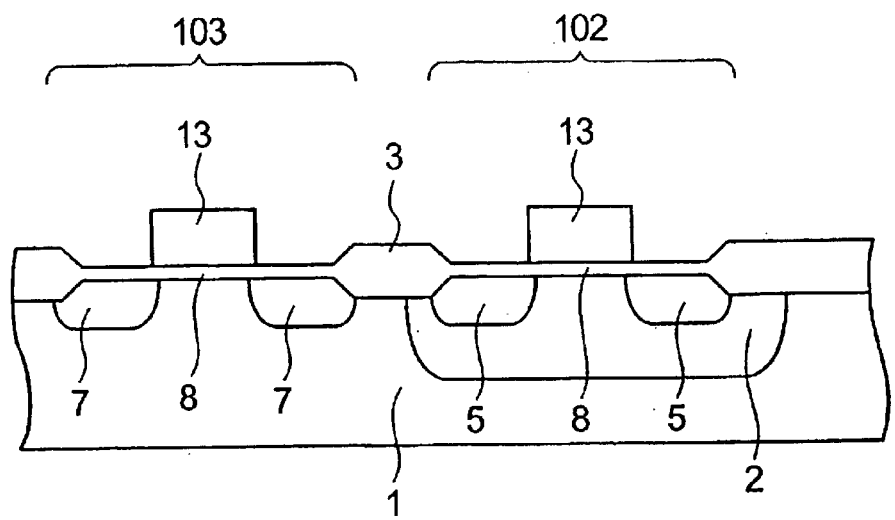
FIG. 3
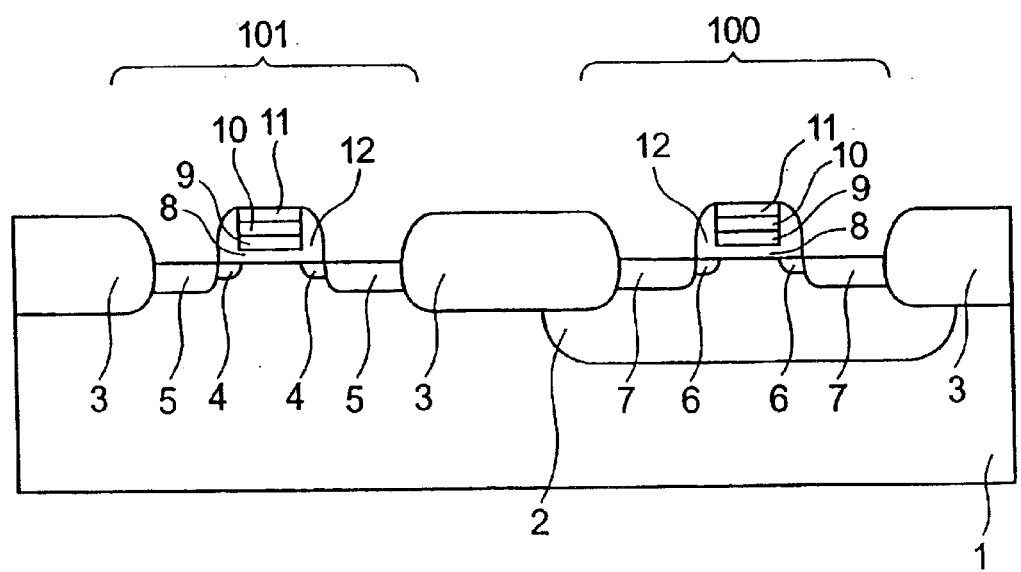

SEMICONDUCTOR INTEGRATED CIRCUIT DEVICE

BACKGROUND OF THE INVENTION

1. Field of the Invention

The present invention relates to a semiconductor integrated circuit device composed of an MOSFET for use in a circuit that operates through DC drive or low-frequency drive.

2. Description of the Related Art

FIG. 2 is a schematic sectional view showing a conventional semiconductor device. A gate electrode 13 formed of N+ type polycrystalline silicon is formed above a P-well layer 2 on an N-type semiconductor substrate 1 through a gate insulating film 8 to thereby form an N-channel MOS transistor (hereinafter, referred to as NMOS) 102. Another gate electrode 13 similarly formed of N+ polycrystalline silicon is formed above the N-type semiconductor substrate 1 through the gate insulating film 8 to thereby form a p-channel MOS transistor (hereinafter, referred to as PMOS) 103. In other words, both of the transistors constitute a complementary MOS structure (hereinafter, referred to as CMOS). In regions of the P-well layer 2 outside both sides of the gate electrode 13 in the NMOS 102, source/drain regions 5 are formed. In regions of the N-type semiconductor substrate 1 outside both sides of the gate electrode 13 in the PMOS 103, source/drain regions 7 are formed. A field insulation film 3 is formed for element isolation between the NMOS 102 and the PMOS 103.

In general, those MOSFETs have been used in the circuit operating through the DC drive or low-frequency drive.

The MOS transistor generally adopts a silicon surface right below the gate insulating film as a channel and thus, tends to suffer influences of a defect existing at an interface between the gate insulating film and the silicon or a surface level. When operating the transistor, in particular, through the DC drive or low-frequency drive at 500 kHz or lower, exchanges of the electrons and holes frequently occur because of the above surface level and defect, which appears in the form of noise against a high frequency signal, i.e., so-called 1/f noise. This causes a serious problem in a semiconductor integrated circuit. The defect or surface level develops due to dangling bonds resulting from discontinuous atomic bonds between silicon dioxide and silicon, for example, constituting the gate insulating film; a defect exiting on the silicon surface prior to the formation of the gate insulating film; a deposition thereon; and the like. The complete removal thereof is hardly attained.

The noise generated due to the defect or the surface level increases as the gate of the MOS transistor reduces its area. That is, provided that a channel length of the MOS transistor is represented by L and a channel width thereof is represented by W, the noise becomes more conspicuous during the operation at a high frequency with a decrease in value of L×W.

Among various MOS transistors, a surface channel MOS transistor exhibits such a tendency more remarkably than a buried channel MOS transistor does. This is because the channel of the surface channel transistor is formed at the interface between the gate insulating film and the silicon, but the channel of the buried channel transistor is formed deep inside the silicon as viewed from the interface between the gate insulating film and the silicon, so that the buried channel transistor hardly suffers the aforementioned influences of the defect and the surface level. Namely, in the MOS transistor having the gate electrode formed of the N+ polycrystalline silicon, the NMOS serving as the surface channel transistor involves more noise components against signal components than the PMOS serving as the buried channel transistor.

On the other hand, in general, the PMOS is inferior to the NMOS in driving power. This results from the fact that carriers constituting a drain current are electrons in the NMOS but are holes in the PMOS. That is, a mobility of the hole corresponds to about ⅓ of that of the electron and hence, the driving power of the PMOS results in about ⅓ of that of the NMOS. Therefore, generally in the semiconductor integrated circuit for which the high driving power is required with a small area, the NMOS is used in many cases rather than the PMOS.

However, as described above for the prior art, the NNOS generally serves as the surface channel transistor and therefore suffers such a problem as an increased noise.

Alternatively, for the purpose of relieving the influence of the noise, the application of a method of increasing the gate area of the NMOS or a method of using the PMOS in many cases causes an increase in element area, which may lead to an increased chip area. As a result, there arises a problem in that the cost is increased.

SUMMARY OF THE INVENTION

The present invention has been made in order to solve the above problems and accordingly, the present invention provides a semiconductor integrated circuit device including an amplifier circuit including: a first PMOS transistor having a gate electrode and a drain electrode connected together; a second PMOS transistor having a gate electrode connected to the gate electrode of the first PMOS transistor and a source electrode connected to a source electrode of the first PMOS transistor; a first NMOS transistor having a drain electrode connected to the drain electrode of the first PMOS transistor and a gate electrode set as an first input terminal; and a second NMOS transistor having a drain electrode connected to a drain electrode of the second PMOS transistor, a source electrode connected to a source electrode of the first NMOS transistor, and a gate electrode set as a second input terminal, wherein one of the first NMOS transistor and the second NMOS transistor includes a buried channel transistor.

Further, in the semiconductor integrated circuit device of the present invention, the gate electrode of the NMOS transistor is formed of the P-type polycrystalline silicon.

Further, in the semiconductor integrated circuit device of the present invention, the gate electrodes of all the MOS transistors are formed of the P-type polycrystalline silicon.

Moreover, the semiconductor integrated circuit device of the present invention further comprises a differential amplifier circuit having an MOSFET, in which the gate electrodes of all the MOS transistors are formed of the P-type polycrystalline silicon.

Moreover, the semiconductor integrated circuit device of the present invention further comprises an A/D converter having an MOSFET, in which the gate electrodes of all the MOS transistors are formed of the P-type polycrystalline silicon.

Moreover, the semiconductor integrated circuit device of the present invention further comprises a D/A converter having an MOSFET, in which the gate electrodes of all the MOS transistors are formed of the P-type polycrystalline silicon.

BRIEF DESCRIPTION OF THE DRAWINGS

In the accompanying drawings:

FIG. 2 is a schematic sectional view showing a manufacturing method for a conventional semiconductor integrated circuit device;

FIG. 3 is a schematic sectional view showing a structure of the semiconductor integrated circuit device according to the present invention.

DETAILED DESCRIPTION OF THE PREFERRED EMBODIMENTS

Figure 1:
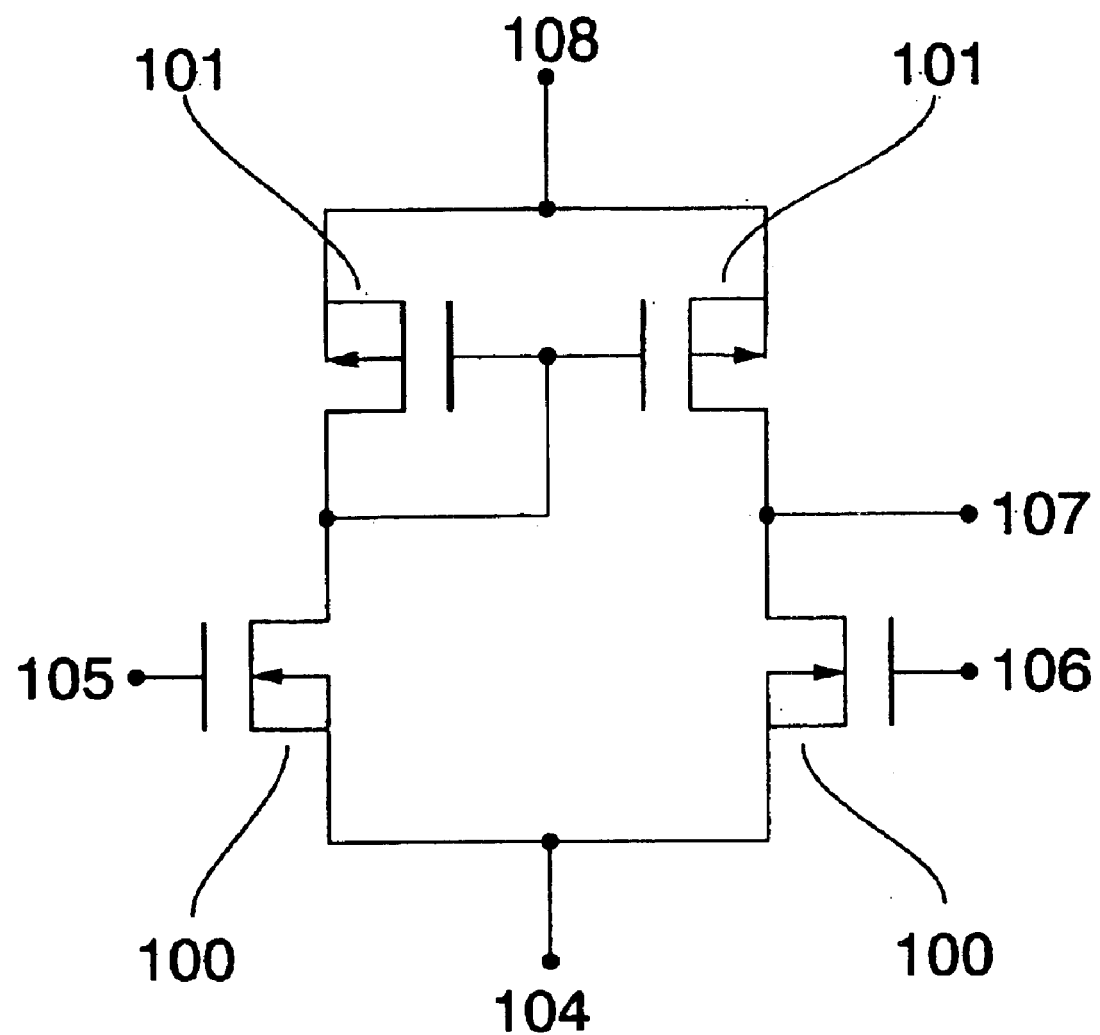
FIG. 1 schematically shows a configuration of an amplifier circuit of a semiconductor integrated circuit device according to an embodiment of the present invention.

According to the present invention, in a semiconductor integrated circuit device operating through DC drive or low-frequency drive at 500 kHz or lower, for which an NMOS is frequently used relative to a PMOS, the NMOS is in the form of a surface channel MOSFET, to thereby promote an improvement in driving power thereof together with downsizing.

In general, the buried channel MOS transistor has poor subthreshold characteristics as compared with the surface channel transistor and suffers such a problem as a large leak current. As a conceivable measure for preventing the leak current from increasing, a channel length of the MOS transistor may be increased. However, this causes the reduction in driving power. On the other hand, in order to improve the subthreshold characteristics, a substrate concentration may be lowered, provided that a uniform thickness is obtained over a gate oxide film. However, this causes a drain depletion layer to easily expand to thereby induce punch-through more easily. In order to avoid such defects, the channel length has to be increased in the end. In other words, the buried channel MOS transistor tends to involve the larger channel length than the surface channel transistor from the viewpoint of leak current or punch-through.

However, in some cases, a minimum channel length of the NMOS is not necessarily set according to the above characteristics. Such cases correspond to cases where a bipolar operation (snap back phenomenon) due to a substrate current of the NMOS is caused. The phenomenon takes place because the generation of hot carriers is accelerated by the increased drain current and drain field as the channel length is reduced. The generation of the hot carriers in the NMOS is less observed in the buried channel than in the surface channel. From this point, the following may be achieved. That is, when the limitation on the degree to which the channel length of the NMOS can be reduced is not based on the leak current or punch-through, the buried channel MOS transistor contributes to breakthrough of the limitation regarding the short channel due to the snap back phenomenon. Namely, in this case, the short channel of the NMOS can be promoted as compared with the case of using the surface channel MOS transistor.

Also, the surface channel transistor is susceptible to the influence of the defect existing at the interface between the gate oxide film and the silicon or surface level in comparison with the buried channel transistor. As a result, the noise is more easily generated. The noise can be reduced as the channel length or channel width is increased. Thus, the surface channel MOS transistor should set the channel length larger than that of the buried channel MOS transistor.

Taking into consideration the above, the buried channel type structure is preferred for the NMOS. As a measure for achieving this, it is supposedly effective to adopt the p-type gate electrode of the NMOS as the P-type one as in the present invention.

Namely, a CMOS structure obtained by adopting the NMOS of the present invention which enables both the high driving power and the reduced noise is considerably effective.

Hereinafter, embodiments of the present invention will be described with reference to the accompanying drawings.

In this embodiment, the case of applying the present invention to the MOSFET formed on a single crystal semiconductor substrate will be described. FIG. 3 shows a structure of the CMOS of the present invention in section. The semiconductor integrated circuit according to the present invention is composed of the PMOS having a P-type gate electrode and the NMOS having the P-type gate electrode.

In FIG. 3, a P-well layer 2 is formed on an N-type semiconductor substrate 1. A PMOS 101 is formed on the N-type semiconductor substrate 1. The gate electrode has a laminate structure formed of P-type polysilicon 9 and a metal silicide film 10. Thus, a surface channel P-type MOSFET 101 is achieved, in which the surface channel is realized in an enhancement PMOS.

Also, an NMOS 100 is formed on the P-well layer 2, but the gate electrode similarly has a laminate structure formed of the P-type polysilicon 9 and the metal silicide film 10. Thus, the buried channel N-type MOSFET 100 is achieved, in which the buried channel is realized in an enhancement NMOS.

Here, sources and drains of the MOSFETs include low concentration drain/source regions and high concentration drain/source regions each exhibiting conductivity according to a polarity of the respective MOSFETs. That is, as for the PMOS, a P-type impurity region 4 and a P+ type impurity region 5 are formed. As for the NMOS, an N-type impurity region 6 and an N+ type impurity region 7 are formed. Also, upon manufacturing the transistor with such a structure, the injection of the N type impurity using P-type polysilicon as a mask involves the concern about the increased resistance and the depletion of the gate electrode due to the reduction in concentration of the P-type polysilicon. As a method for solving such problems, the metal silicide film 10 is formed on the P-type polysilicon 9 and NSG (nondoped silicate glass) 11 is further formed on the metal silicide film 10. After that, the P-type polysilicon 9, the metal silicide film 10, and the NSG 11 are etched using the same mask. The NSG 11 is made to remain until the desired step. Thus, shown in FIG. 3 is the laminate structure of the gate insulating film 8, the P-type polycrystalline silicon gate electrode 9, the metal silicide gate electrode 10, and the NSG 11 all of which are formed on the channel of each MOSFET.

In this way, the P-type polysilicon is adopted for the gate electrode, so that a threshold voltage is lowered in the PMOS. In addition, the P type impurity such as boron or $BF_2$ is used for channel doping for controlling the threshold voltage. Therefore, the surface channel MOSFET is formed in the PMOS. On the other hand, the NMOS has a high threshold voltage in contrast with the PMOS. Thus, upon the channel doping for controlling the threshold voltage, the N type impurity such as phosphorus or arsenic is used to form an impurity region with a reverse conductivity of the P-well layer. Accordingly, in the NMOS, the buried channel MOSFET is formed. As mentioned above, in the NMOS structure, the channel is formed deep below the interface between the silicon and the gate insulating film. Therefore, it is free of influence of the defect of the interface or the surface level, to thereby achieve the low noise characteristics.

An embodiment of the semiconductor integrated circuit of the present invention using the above MOSFET is shown in FIG. 1. FIG. 1 shows an amplifier circuit composed of the N-type MOSFET and the P-type MOSFET. Here, in all the MOSFETs, as shown in FIG. 3, the NMOS and the PMOS are constituted of the buried channel N-type MOSFET 100 and the surface channel P-type MOSFET, respectively.

In FIG. 1, in particular, input signals inputted from an input terminal are received by a gate electrode of the buried channel N-type MOSFET 100, not by the surface channel type one as in the conventional cases. This structure is adopted for eliminating the influence of the noise signals superimposed on the externally applied signals as much as possible.

If the noise superimposition occurs in an element receiving the input signal, the noise is amplified in an amplifier circuit and output signals are outputted in an output terminal 107 with the noise signals largely superimposed thereon. In this case, in all the circuits following the output terminal, the noise signals cause a deteriorated circuit precision and an erroneous operation. The noise signals once amplified in the amplifier circuit are hardly eliminated. If attempting to eliminate the noise signals, an optional circuit such as a filter circuit should be added for eliminating the noise, which may lead to the increased chip area together with the increased cost. As described above, the present invention provides advantages in that the optional noise eliminating circuit is unnecessary and the noise can be eliminated by the input element or input circuit itself.

By adding another circuit such as a constant current circuit or an output circuit, although not shown in the figure, to the circuit of FIG. 1, an OP-Amp (operational amplifier), a comparator, and such circuits can be configured. In any case, the buried channel N-type MOSFET of the present invention is used for a portion to which the input signal is inputted as shown in FIG. 1, which enables the circuit with the reduced noise.

Figure 4:
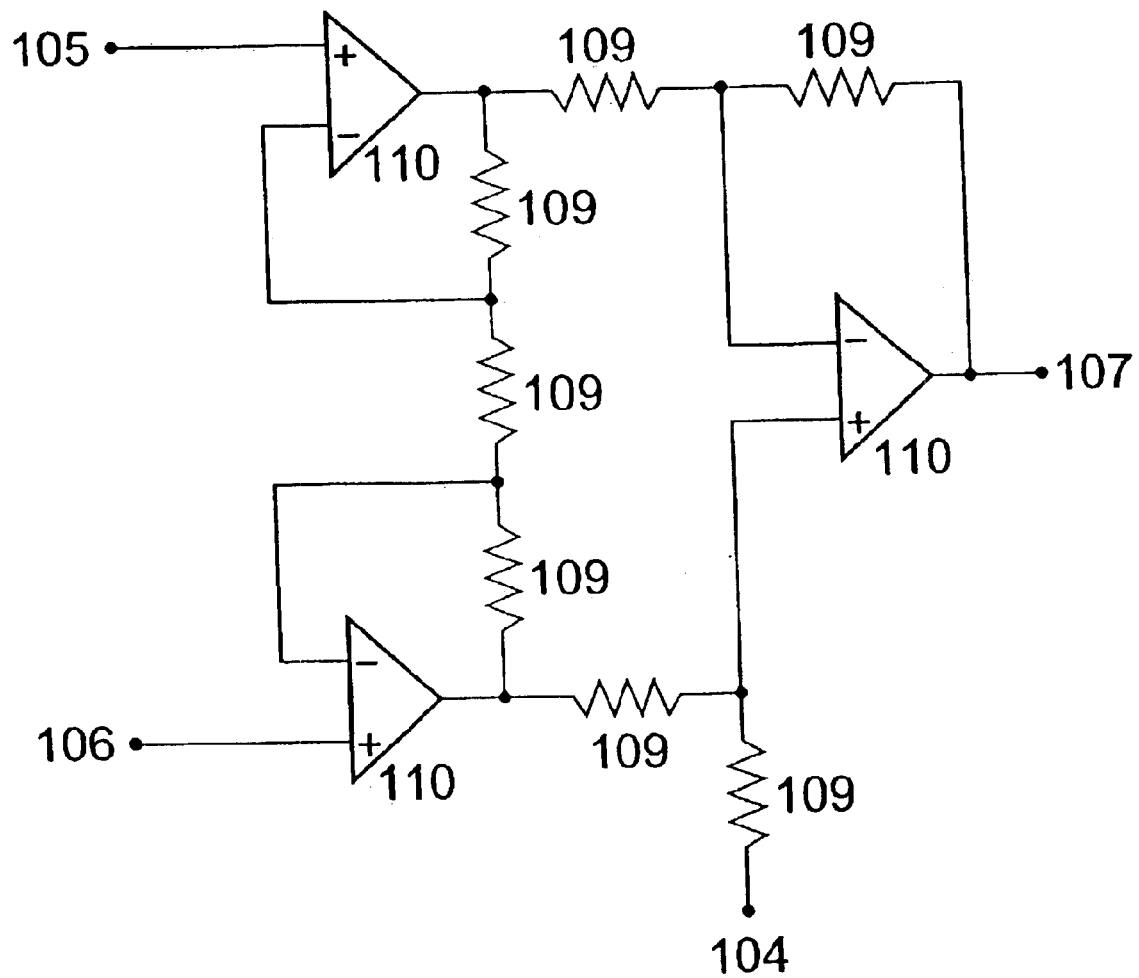
FIG. 4 schematically shows a configuration of a differential amplifier circuit of a semiconductor integrated circuit device according to an embodiment of the present invention.

FIG. 4 shows a differential amplifier circuit composed of an amplifier circuit and a resistance. Also in this case, all the MOSFETs include the buried channel N-type MOSFET and the surface channel P-type MOSFET. In addition, the buried channel N type MOSFET is used for an element in a portion to which the input signal is inputted, which enables the differential amplifier circuit with the reduced noise.

Also, the present invention is effective for use in any circuit that is composed of the MOSFET, which operates at a high frequency. In particular, given as an example of a circuit for which the high precision is required upon the operation at the high frequency are an A/D converter, a D/A converter, and a sensor processing circuit for processing electric signals of an extremely weak current all the time, although not shown in the figure.

According to the present invention, in the semiconductor integrated circuit composed of the MOSFET, the NMOS is configured as the buried channel MOSFET, whereas the PMOS is configured as the surface channel MOSFET. Consequently, the circuit can be achieved which operates through the DC drive or low-frequency drive at 500 kHz or less with the reduced noise. Also, according to the present invention, the optional circuit for eliminating the noise or the like is unnecessary and the number of manufacturing steps is not increased, whereby the low noise circuit can be provided at the extremely low costs.

What is claimed is:

1. A semiconductor integrated circuit device comprising: an amplifier circuit comprised of a first PMOS transistors having a gate electrode and a drain electrode connected together, a second PMOS transistor having a gate electrode connected to the gate electrode of the first PMOS transistor and a source electrode connected to a source electrode of the first PMOS transistor, a first NMOS transistor having a drain electrode connected to the drain electrode of the first PMOS transistor and a gate electrode set as a first input terminal, and second NMOS transistor having a drain electrode connected to a drain electrode of the second PMOS transistor, a source electrode connected to a source electrode of the first NMOS transistor, and a gate electrode set as a second input terminal, at least one of the first NMOS transistor and the second NMOS transistor being comprised of a buried channel transistor; wherein the semiconductor integrated circuit device comprises an A/D converter.

2. A semiconductor integrated circuit device comprising: an amplifier circuit comprised of a first PMOS transistor having a gate electrode and a drain electrode connected together, a second PMOS transistor having a gate electrode connected to the gate electrode of the first PMOS transistor and a sourse electrode connected to a sourse electrode of the first PMOS transistor,a first NMOS transistor having a drain electrode connected to the drain electrode of the first PMOS transistor and a gate electrode set a first input terminal, and a second NMOS transistor having a drain electrode connected to a drain electrode of the second PMOS transistor, a sourse electrode connected to a sourse electrode of the first NMOS transistor, and a gate electrode set as a second terminal, at least one of the first NMOS transistor and the second NMOS transistor being comprised of a buried channel transistor; wherein the semiconductor integrated circuit device comprises an D/A converter.

3. A semiconductor integrated circuit device comprising: an amplifier circuit comprised of a first surface channel PMOS transistor having a gate electrode and a drain electrode connected together, a second surface channel PMOS transistor having a gate electrode connected to the gate electrode of the first surface channel PMOS transistor and a source electrode connected to a sourse electrode of the first surface channel PMOS transistor, a first buried channel NMOS transistor having a drain electrode connected to the drain electrode of the first surface channel PMOS transistor and a gate electrode set as a first input terminal, and a second buried channel NMOS transistor having a drain electrode connected to a drain electrode of the second surface channel PMOS transistor, a sourse electrode connected to a sourse electrode of the first buried channel NMOS transistor, and a gate electrode set as a second input terminal; wherein the semiconductor integrated circuit device comprises a A/D converter.

4. A semiconductor integrated circuit device according to claim 3; wherein the gate electrode of at least one of the first buried channel NMOS transistor and second buried channel NMOS transistor is formed of P-type polycrystalline silicon.

5.A semiconductor integrated circuit device according to claim 3; wherein the gate electrode of each of the first buried channel NMOS transistor and the second buried channel NMOS transistor is formed of P-type polycrystalline silicon.

6. A semiconductor integrated circuit device comprising: an amplifier circuit comprised of a first surface channel PMOS transistor having a gate electrode and a drain electrode connected together, a second surface channel PMOS transistor having a gate electrode connected to the gate electrode of the first surface channel PMOS transistor and a source electrode connected to a sourse electrode of the first surface channel PMOS transistor, a first buried channel NMOS transistor having a drain electrode connected to the drain electrode of the first surface channel PMOS transistor and a gate electrode set as a first input terminal, and a second buried channel NMOS transistor having a drain electrode connected to a drain electrode of the second surface channel PMOS transistor, a source electrode connected to a source electrode of the first buried channel NMOS transistor, and a gate electrode sat as a second input terminal, wherein the semiconductor integrated circuit device comprises a D/A converter.

7. A semiconductor integrated circuit device according to claim 3; wherein the gate electrode of each of the first buried channel NMOS transistor and the second buried channel NMOS transistor comprises a P-type gate electrode.

* * * * *